(12) United States Patent
Gao et al.

(10) Patent No.: US 9,537,506 B2
(45) Date of Patent: Jan. 3, 2017

(54) ELECTRONIC DEVICE WITH KEYS AND VOLTAGE DETECTING METHOD THEREOF

(71) Applicant: Shenzhen Airdrawing Technology Service Co., Ltd, Shenzhen (CN)

(72) Inventors: Jun-Juan Gao, Shenzhen (CN); Xiao-Wei Yang, Shenzhen (CN); Yang Wang, Shenzhen (CN); Chun-Ching Chen, New Taipei (TW)

(73) Assignee: Shenzhen Airdrawing Technology Service Co., Ltd, Shenzhen (CN)

( * ) Notice: Subject to any disclaimer, the term of this patent is extended or adjusted under 35 U.S.C. 154(b) by 472 days.

(21) Appl. No.: 14/140,292

(22) Filed: Dec. 24, 2013

(65) Prior Publication Data
US 2014/0354077 A1    Dec. 4, 2014

(30) Foreign Application Priority Data

Jun. 3, 2013 (CN) .......................... 2013 1 02158528

(51) Int. Cl.
*H01H 47/00* (2006.01)
*H03M 11/24* (2006.01)

(52) U.S. Cl.
CPC .............. *H03M 11/24* (2013.01); *Y10T 307/76* (2015.04)

(58) Field of Classification Search
CPC ..... H03M 11/003; H03M 11/12; H03M 11/10; H03M 11/20; H03M 11/24; Y10T 307/76; H01H 47/00; H03K 17/98; G06F 3/0238; G06F 3/0219; G06F 3/0227; G06F 3/016
See application file for complete search history.

(56) References Cited

U.S. PATENT DOCUMENTS

| 2006/0082541 A1* | 4/2006 | Wu | ........................ H03M 11/24 345/156 |
| 2011/0078476 A1* | 3/2011 | Han | .......................... G06F 1/32 713/320 |

* cited by examiner

*Primary Examiner* — An T Nguyen
(74) *Attorney, Agent, or Firm* — Zhigang Ma

(57) ABSTRACT

An electronic device with a plurality of keys which correspond to a plurality of standard voltages respectively comprises a voltage generation module, a detection module, storage, an acquiring module, a comparison module, and an extraction module. The voltage generation module with an initial voltage decreases the initial voltage to the standard voltage corresponding to the pressed key. The detection module detects whether the current voltage of the voltage generation module is equal to the initial voltage. The storage stores the current voltage as a reference voltage when the current voltage is not equal to the initial voltage. The acquiring module acquires a current voltage of the voltage generation module after a predetermined time. The comparison module compares the acquired current voltage with the reference voltage. When the acquired current voltage is equal to the reference voltage, the extraction module executes an operation corresponding to the reference voltage.

10 Claims, 2 Drawing Sheets

US 9,537,506 B2

ELECTRONIC DEVICE WITH KEYS AND VOLTAGE DETECTING METHOD THEREOF

BACKGROUND

1. Technical Field

The present disclosure relates to electronic devices, particularly to an electronic device with a plurality of keys.

2. Description of Related Art

An electronic device includes a plurality of keys and a plurality of standard voltages corresponding to the keys in a one-to-one relationship. The electronic device further presets an initial voltage. When any one of the keys is being pressed, the initial voltage decreases to the corresponding standard voltage in a linear manner for executing a corresponding operation. However, during the decreasing process, the electronic device may recognize a voltage between the initial voltage and the corresponding voltage as a standard voltage corresponding to other keys, thus a misoperation may occurred.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the electronic device and voltage detecting method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as in an EPROM. Modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will be described with reference to the drawings.

Figure 1:
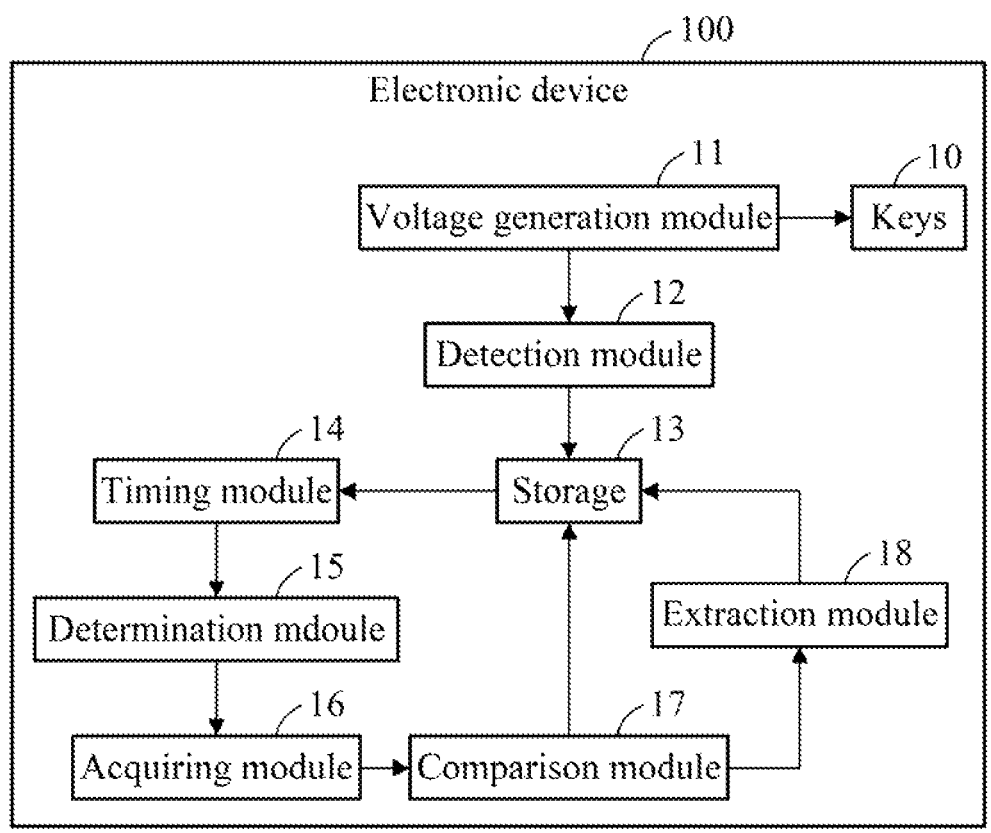
FIG. 1 is a block diagram of an electronic device in accordance with an embodiment.

FIG. 1 shows an electronic device 100 of the embodiment. The electronic device 100 includes a plurality of keys 10. Each of the keys 10 being pressed generates a corresponding voltage for executing a corresponding operation.

The electronic device 100 further includes a voltage generation module 11, a detection module 12, storage 13, timing module 14, a determination module 15, an acquiring module 16, a comparison module 17, and an extraction module 18.

The voltage generation module 11 presets an initial voltage. The voltage generation module 11 is used for changing the initial voltage in a linear manner when one of keys 10 is being pressed, and generates a detecting signal. In the embodiment, the initial voltage is 3.3 volt (V). In other embodiments, the initial voltage can be set by manual operation.

The detection module 12 connects to the voltage generation module 11, and is used for detecting whether the current voltage of the voltage generation module 11 is equal to the initial voltage in response to the detecting signal. When the current voltage is not equal to initial voltage, one of the keys 10 is being pressed and the detection module 12 generates a storing signal. When the current voltage is equal to initial voltage, none of the keys 10 is being pressed.

The storage 13 connects to the detection module 12, and presets a plurality of control signals which corresponds to the standard voltages in a one-to-one relationship. The storage 13 stores a current voltage<<IS it one or more than one>><<there is only one reference voltage, but the value maybe changed>> of the voltage generation module 11 as a reference voltage in response to the storing signal, and generates a timing signal. In the embodiment, the storage 13 is a memory of the electronic device 100, and also may be an external storage card, such as a smart media (SM) card, or secure digital (SD) card, for example.

The timing module 14 connects to the storage 13, and is used for timing a waiting duration in response to the timing signal.

The determination module 15 determines whether the waiting duration exceeds a predetermined value. When the waiting duration exceeds the predetermined value, the determination module 15 generates an acquiring signal. When the waiting duration does not exceed the predetermined value, the determination module 15 generates and sends the detecting signal to the detection module 12. In the embodiment, the predetermined value is 5 millisecond (MS). In other embodiments, the predetermined value can be set by manual operation.

The acquiring module 16 acquires the current voltage of the voltage generation module 11 in response to the acquiring signal.

The comparison module 17 compares the acquired current voltage with the reference voltage. When the acquired current voltage is equal to the reference voltage, the reference voltage is the standard voltage corresponding to the pressed key and the comparison module 17 generates an extracting signal. When the acquired current voltage is not equal to the reference voltage, the reference voltage is not the standard voltage corresponding to the pressed key and the comparison module 17 controls the storage 13 to replace the reference voltage with the acquired current voltage of the voltage generation module 11.

The extraction module 18 extracts the control signal corresponding to the matched standard voltage for executing a corresponding operation in response to the extracting signal.

Figure 2:
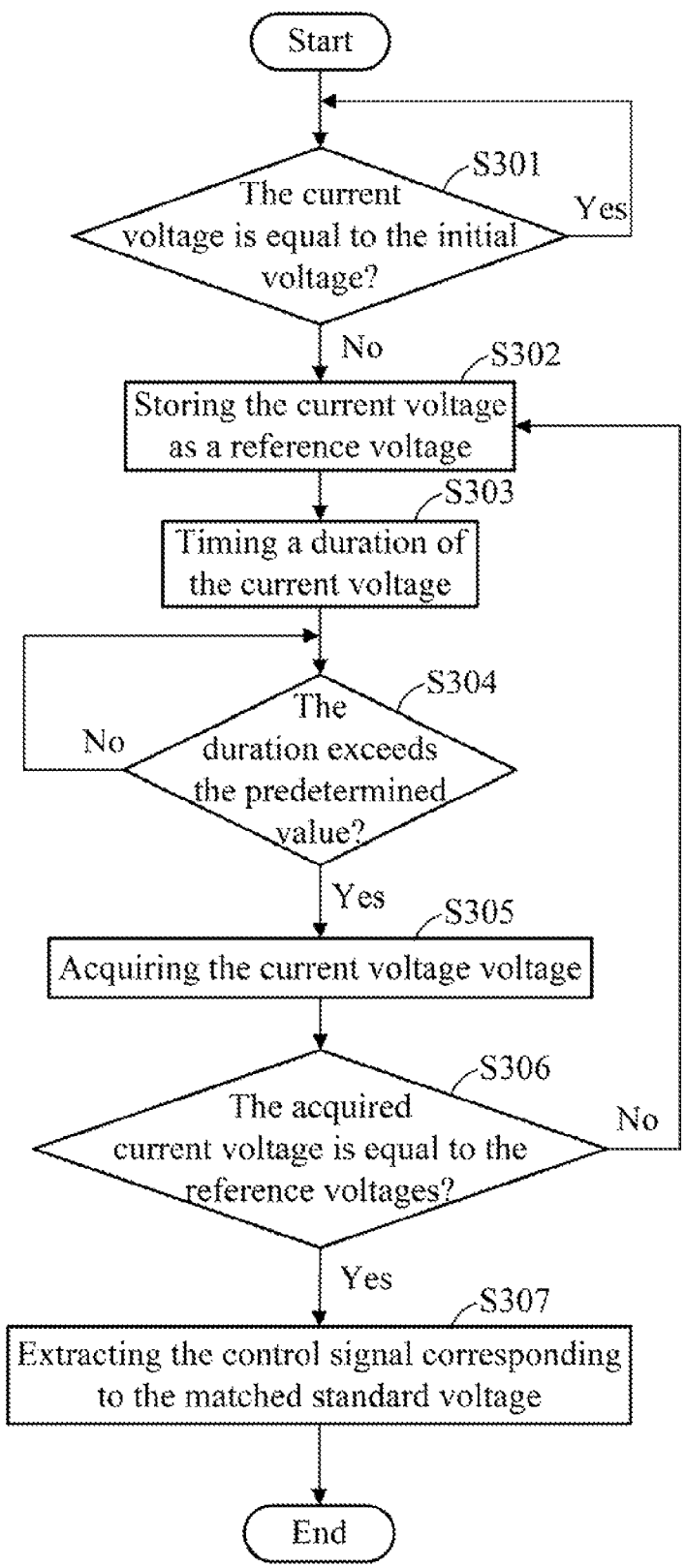
FIG. 2 is a flowchart of a voltage detecting method in accordance with the embodiment.

FIG. 2 shows a voltage detecting method applied to an electronic device 100 with a plurality of keys 10. Each of the keys 10 being pressed generates a corresponding voltage for executing a corresponding operation. The voltage detecting method includes the following steps.

In step S301, the detection module 12 detects whether the current voltage is equal to the initial voltage. If the current voltage is not equal to the initial voltage, one of the keys 10 is being pressed and the procedure goes to S302. If the current voltage is equal to the initial voltage, the procedure returns to S301.

In step S302, the storage 13 stores the current voltage as a reference voltage and generates a timing signal.

In step S303, in response to the timing signal, the timing module 14 times a waiting duration.

In step S304, the determination module 15 determines whether the waiting duration exceeds the predetermined value. If the waiting duration exceeds the predetermined time, the determination module 15 generates an acquiring signal and the procedure goes to S305. If the waiting duration does not exceed the predetermined time, the procedure returns to S304.

In step S305, in response to the acquiring signal, the acquiring module 16 acquires the current voltage of the voltage generation module 11.

In step S306, the comparison module 17 compares the acquired current voltage with the reference voltage. If the acquired current voltage is equal to the reference voltage, the reference voltage is the standard voltage corresponding to the pressed key and the comparison module 17 generates an extracting signal and the procedure goes to S307. If the acquired voltage is not equal to the reference voltage, the reference voltage is not the standard voltage corresponding to the pressed key and the procedure returns to S302.

In step S307, in response to the extracting signal, the extraction module 18 extracts the corresponding control signal for executing a corresponding operation.

In use, while the initial voltage decreases to the corresponding standard voltage, the waiting duration of the current voltage is provided for ensuring that the detected voltage is the standard voltage corresponding to the pressed key, thus misoperation of the pressed key is decreased.

While various embodiments have been described, the disclosure is not to be limited thereto. Various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. An electronic device with a plurality of keys which, when pressed, correspond to a plurality of standard voltages in a one-to-one relationship, the electronic device comprising:
    a voltage generation module with an initial voltage, and for decreasing the initial voltage to the plurality of standard voltages corresponding to the pressed key;
    a detection module for detecting whether a current voltage is equal to the initial voltage;
    a storage connected to the detection module, and for storing the current voltage as a reference voltage when the current voltage is not equal to the initial voltage;
    an acquiring module for acquiring the current voltage of the voltage generation module after a predetermined time;
    a comparison module connected to the acquiring module, and for comparing the acquired current voltage with the reference voltage to ensure the standard voltage corresponding to the pressed key; an extraction module connected to the comparison module;
    wherein when the acquired current voltage is equal to the reference voltage, the reference voltage is the standard voltage corresponding to the pressed key, and the extraction module executes an operation corresponding to the reference voltage and;
    the electronic device further comprising a timing module and a determination module, wherein the timing module is connected to the storage and times a waiting duration;
    the determination module is connected to the timing module and determines whether the waiting duration exceeds a predetermined value;
    when the waiting duration of the current voltage exceeds the predetermined value, the determination module controls the acquiring module to acquire the current voltage of the voltage generation module.

2. The electronic device of claim 1, wherein the predetermined value can be set by manual operations.

3. The electronic device of claim 1, wherein when any one of the keys is being pressed, the voltage generation module decreases the initial voltage to the corresponding standard voltage in a linear manner.

4. The electronic device of claim 1, wherein the storage further stores a plurality of control signals which correspond to the standard voltages in a one-to-one relationship; when the acquired voltage is equal to the reference voltage, the extraction module extracts the control signal corresponding to the reference voltage.

5. The electronic device of claim 1, wherein when the acquired current voltage is not equal to the reference voltage, the reference voltage is not the standard voltage corresponding to the pressed key, and the comparison module controls the storage to replace the reference voltage by the acquired current voltage.

6. A voltage detecting method applied to an electronic device with a plurality of keys;
    the plurality of keys correspond to a plurality of standard voltage when being pressed;
    the electronic device comprising a voltage generation module for generating voltage;
    the voltage detecting method comprising: detecting a current voltage of the voltage generation module;
    determining whether one of the key is being pressed;
    storing the current voltage as a reference voltage when one of the key is being pressed;
    acquiring the current voltage of the voltage generation module after a predetermined time;
    comparing the acquired current voltage and the reference voltage for ensuring the plurality of standard voltage corresponding to the pressed key;
    executing an operation corresponding to the pressed key when the acquired current voltage is equal to the reference voltage; and
    wherein the step of acquiring the current voltage of the voltage generation module after a predetermined time comprising:
    timing a waiting duration;
    determining whether the waiting duration exceeds a predetermined value;
    acquiring the current voltage of the voltage generation module when the waiting duration exceeds the predetermined value.

7. The electronic device of claim 6, wherein the predetermined value can be set by manual operations.

8. The voltage detecting method of claim 6, wherein the electronic device comprises a voltage generation module with an initial voltage; the step of determining whether one of the key is being pressed comprising: determining whether the current voltage is equal to the initial voltage.

9. The voltage detecting method of claim 8, wherein when any one of the keys is being pressed, the voltage generation module decreases the initial voltage to the corresponding standard voltage in a linear manner.

10. The voltage detecting method of claim 6, wherein when the acquired current voltage is not equal to the reference voltage, replacing the reference voltage by the acquired voltage.

* * * * *